(12) United States Patent
Kholodenko et al.

(10) Patent No.: US 8,261,905 B2
(45) Date of Patent: Sep. 11, 2012

(54) WAFER CARRIER DRIVE APPARATUS AND METHOD FOR OPERATING THE SAME

(75) Inventors: Arnold Kholodenko, San Francisco, CA (US); Anwar Husain, Pleasanton, CA (US); George Khait, Alameda, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/786,868

(22) Filed: May 25, 2010

(65) Prior Publication Data

US 2010/0230243 A1 Sep. 16, 2010

Related U.S. Application Data

(63) Continuation of application No. PCT/US2008/087190, filed on Dec. 17, 2008.

(60) Provisional application No. 61/017,471, filed on Dec. 28, 2007.

(51) Int. Cl.
B65G 35/00 (2006.01)

(52) U.S. Cl. .......... 198/619; 198/467.1; 198/468.9; 414/939

(58) Field of Classification Search .......... 198/619, 198/467.1, 468.9; 414/939
See application file for complete search history.

(56) References Cited

U.S. PATENT DOCUMENTS

| | | | | |
|---|---|---|---|---|
| 3,202,406 A * | 8/1965 | Tack | ........ | 432/239 |
| 3,731,166 A * | 5/1973 | Inuzuka et al. | ........ | 318/35 |
| 4,220,899 A * | 9/1980 | von der Heide | ........ | 318/135 |
| 4,518,078 A * | 5/1985 | Garrett | ........ | 198/775 |
| 4,624,617 A * | 11/1986 | Belna | ........ | 414/347 |
| 4,664,578 A * | 5/1987 | Kakehi | ........ | 414/217 |
| 4,805,761 A * | 2/1989 | Totsch | ........ | 198/619 |
| RE33,780 E * | 12/1991 | Itagaki et al. | ........ | 29/741 |
| 5,133,285 A * | 7/1992 | Mahler et al. | ........ | 118/719 |
| 5,170,714 A * | 12/1992 | Katagiri | ........ | 104/282 |
| 5,229,669 A * | 7/1993 | Takei | ........ | 310/12.31 |
| 5,234,303 A * | 8/1993 | Koyano | ........ | 414/217 |
| 5,377,816 A * | 1/1995 | Deligi et al. | ........ | 198/619 |
| 5,639,206 A * | 6/1997 | Oda et al. | ........ | 414/749.2 |
| 5,647,477 A * | 7/1997 | Morishita | ........ | 198/619 |
| 5,833,426 A * | 11/1998 | Marohl | ........ | 414/217.1 |
| 5,881,649 A * | 3/1999 | Hasegawa et al. | ........ | 104/167 |
| 5,906,262 A * | 5/1999 | Miki | ........ | 198/341.02 |
| 5,909,995 A * | 6/1999 | Wolf et al. | ........ | 414/217 |
| 5,980,193 A * | 11/1999 | Clifton et al. | ........ | 414/749.2 |
| 5,989,342 A * | 11/1999 | Ikeda et al. | ........ | 118/52 |
| 6,183,831 B1 * | 2/2001 | Hughes et al. | ........ | 428/833.6 |
| 6,318,951 B1 * | 11/2001 | Schmidt et al. | ........ | 414/744.5 |

(Continued)

*Primary Examiner* — Joseph A Dillon, Jr.
(74) *Attorney, Agent, or Firm* — Martine Penilla Group, LLP

(57) ABSTRACT

A drive rail includes a sealed interior cavity and an exterior drive surface that extends along a length of the drive rail. A first magnetic member is disposed within the interior cavity and adjacent to a surface of the interior cavity that is immediately opposite the exterior drive surface. A drive mechanism is disposed within the interior cavity and in connection with the first magnetic member, and is configured to move the first magnetic member within the interior cavity along the length of the drive rail, such that the first magnetic member remains immediately opposite the exterior drive surface. The first magnetic member is configured to magnetically couple through the exterior drive surface to a wafer carrier disposed adjacent to the exterior drive surface. Movement of the first magnetic member within the interior cavity along the drive rail causes corresponding movement of the wafer carrier along the exterior drive surface.

12 Claims, 8 Drawing Sheets

U.S. PATENT DOCUMENTS

| | | | |
|---|---|---|---|
| 6,402,118 B1 * | 6/2002 | Nijsse et al. | 248/550 |
| 6,453,543 B1 * | 9/2002 | Tinner et al. | 29/607 |
| 6,517,961 B1 * | 2/2003 | Agata et al. | 428/702 |
| 6,561,343 B2 * | 5/2003 | Miyauchi et al. | 198/619 |
| 6,712,907 B1 * | 3/2004 | Pratt et al. | 118/719 |
| 6,919,001 B2 * | 7/2005 | Fairbairn et al. | 204/298.25 |
| 6,969,966 B2 * | 11/2005 | Ebihara et al. | 318/649 |
| 6,971,832 B2 * | 12/2005 | Ackeret et al. | 414/217 |
| 7,204,192 B2 * | 4/2007 | Lamb et al. | 104/282 |
| 7,377,836 B1 * | 5/2008 | Molnar | 451/5 |
| 7,472,786 B2 * | 1/2009 | Komori | 198/619 |
| 7,575,406 B2 * | 8/2009 | Hofmeister et al. | 414/217 |
| 7,597,186 B2 * | 10/2009 | Chung et al. | 198/619 |
| 7,615,836 B2 * | 11/2009 | Lian et al. | 257/421 |
| 7,770,714 B2 * | 8/2010 | Nozawa et al. | 198/619 |
| 2002/0144881 A1 * | 10/2002 | Miyauchi et al. | 198/619 |
| 2008/0039331 A1 * | 2/2008 | Okazaki et al. | 505/166 |

* cited by examiner

WAFER CARRIER DRIVE APPARATUS AND METHOD FOR OPERATING THE SAME

CLAIM OF PRIORITY

This application claims priority under 35 U.S.C. §§120 and 365(c) as a continuation application of prior International Application PCT/US2008/087190, which was filed on Dec. 17, 2008, and which was published in English under PCT Article 21(2), and which claims priority to U.S. Provisional Patent Application No. 61/017,471, filed on Dec. 28, 2007. The disclosure of the prior international application is incorporated herein by reference.

BACKGROUND OF THE INVENTION

In the fabrication of semiconductor devices such as integrated circuits, memory cells, and the like, a series of manufacturing operations are performed to define features on semiconductor wafers. The semiconductor wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

The series of manufacturing operations for defining features on the semiconductor wafers can include a number of wafer wet processing operations. For example, some wafer wet processing operations may be performed to electroplate materials onto the wafer, chemically etch materials from the wafer, and clean (rinse and dry) the wafer, among others. During certain wafer wet processing operations, it may be necessary to move the wafer through various processing modules, within each of which various wet processing operations may be performed on the wafer. Because some of the chemicals used to process the wafer are aggressive with respect to certain materials, particularly metals, it is of interest to consider wafer movement mechanisms which provide for wafer movement while avoiding metallic residue/particulate generation that could cause damage to the wafer.

SUMMARY OF THE INVENTION

In one embodiment, a semiconductor wafer carrier drive apparatus is disclosed. The apparatus includes a drive rail having an interior cavity and an exterior drive surface. The interior cavity is sealed. The exterior drive surface extends along a length of the drive rail. The apparatus also includes a first magnetic member disposed within the interior cavity. The first magnetic member is disposed adjacent to a surface of the interior cavity immediately opposite the exterior drive surface. The apparatus also includes a drive mechanism disposed within the interior cavity and in connection with the first magnetic member. The drive mechanism is configured to move the first magnetic member within the interior cavity along the length of the drive rail such that the first magnetic member remains immediately opposite the exterior drive surface when moved along the length of the drive rail. The first magnetic member is configured to magnetically couple through the exterior drive surface to a wafer carrier disposed adjacent to the exterior drive surface, such that movement of the first magnetic member causes a corresponding movement of the wafer carrier along the exterior drive surface.

In another embodiment, a system is disclosed for linear translation of a semiconductor wafer. The system includes a drive rail having an interior cavity and an exterior drive surface. The interior cavity is sealed. The exterior drive surface extends along a length of the drive rail. The system also includes a first magnetic member disposed within the interior cavity. The first magnetic member is also disposed adjacent to a surface of the interior cavity immediately opposite the exterior drive surface. The first magnetic member is configured to be moved in a controlled manner within the interior cavity along the length of the drive rail. The system also includes a wafer carrier configured to hold a semiconductor wafer in a substantially horizontal orientation. The system further includes a second magnetic member disposed within an encapsulating housing. The encapsulating housing is affixed to the wafer carrier. The first and second magnetic members are configured to be magnetically coupled to each other through the encapsulating housing and the exterior drive surface when the encapsulating housing is disposed adjacent to the exterior drive surface. Therefore, by way of the magnetic coupling between the first and second magnetic members, movement of the first magnetic member causes a corresponding movement of the encapsulating housing and wafer carrier affixed thereto.

In another embodiment, a method is disclosed for driving a semiconductor wafer carrier. The method includes an operation for positioning a first magnetic member within an interior cavity of a sealed drive rail, such that the first magnetic member is positioned proximate to a drive side of the drive rail. An exterior of the drive side of the drive rail forms a drive surface. The method includes an operation for positioning a second magnetic member, within an encapsulating housing, adjacent to the drive surface of the drive rail. The encapsulating housing is affixed to a wafer carrier. By positioning the second magnetic member adjacent to the drive surface, the second magnetic member establishes a magnetic coupling with the first magnetic member. The method further includes an operation for moving the first magnetic member in a linear direction within the sealed drive rail along the drive side, such that the magnetic coupling between the first and second magnetic members causes the encapsulating housing to be moved along the drive surface of the drive rail. Movement of the encapsulating housing along the drive surface of the drive rail, causes the wafer carrier to be moved along a linear path indexed to the drive rail.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
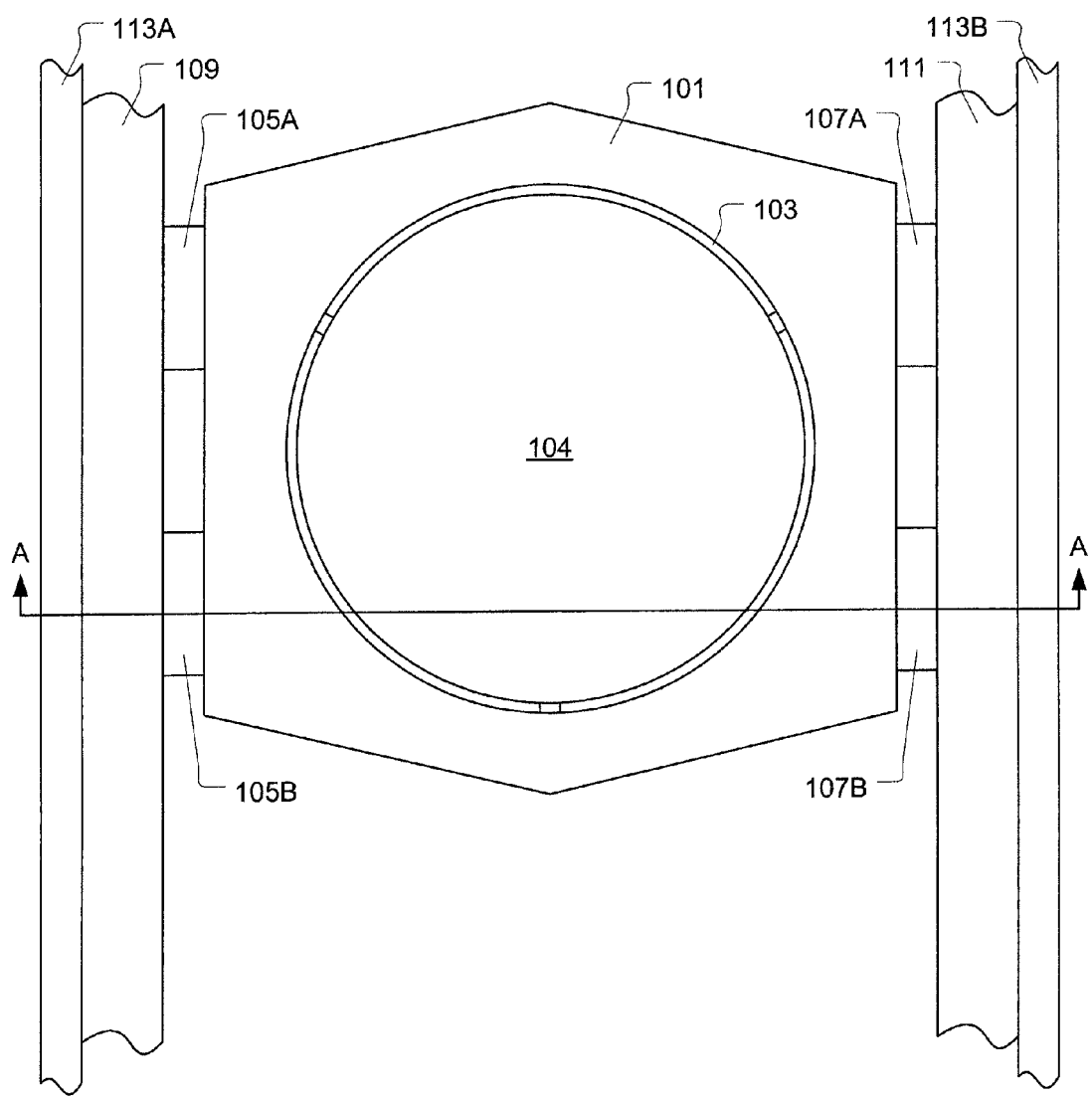
FIG. 1 is an illustration showing a semiconductor wafer drive apparatus, in accordance with one embodiment of the present invention.

FIG. 1 is an illustration showing a semiconductor wafer drive apparatus, in accordance with one embodiment of the present invention. The apparatus includes a drive rail 109 affixed to a wall 113A, such that the drive rail 109 extends along the wall 113A in a substantially level orientation. The apparatus also includes a guide rail 111 affixed to a wall 113B, such that guide rail 111 extends along the wall 113B in a substantially level orientation. Each of the walls 113A and 113B are configured as substantially vertical walls extending parallel to each other. Therefore, the drive rail 109 and guide rail 111 are disposed to be substantially parallel and level with each other. The apparatus further includes a wafer carrier 101 disposed to extend in a substantially horizontal direction from the drive rail 109 to the guide rail 111. The wafer carrier 101 includes a centrally located open region 103 within which a semiconductor wafer ("wafer" hereafter) 104 is received and held.

A number of drive handles 105A/105B are affixed to a drive-side of the wafer carrier 101. Each of the drive handles 105A/105B is configured to interface with an exterior drive surface of the drive rail 109. Also, a number of guide supports 107A/107B are affixed to a guide-side of the wafer carrier 101. Each of the guide supports 107A/107B is configured to interface with a guide track of the guide rail 111. It should be understood that although the embodiment of FIG. 1 shows two drive handles 105A/105B and two guide supports 107A/107B, other embodiments of the wafer drive apparatus can include any number of drive handles 105 and any number of guide supports 107.

Figure 2:
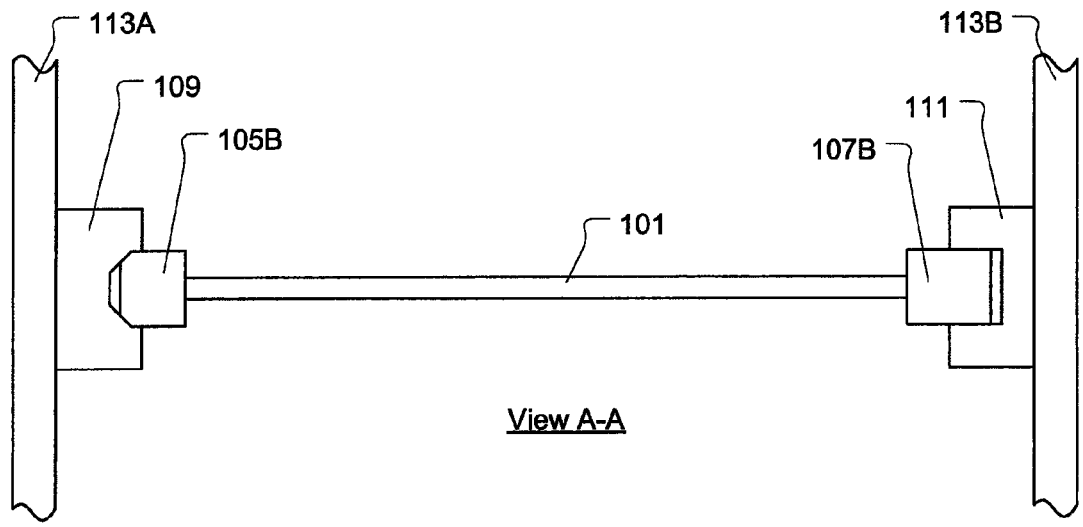
FIG. 2 is an illustration showing a vertical cross-sectional view A-A of the wafer drive apparatus as identified in FIG. 1, in accordance with one embodiment of the present invention.

FIG. 2 is an illustration showing a vertical cross-sectional view A-A of the wafer drive apparatus as identified in FIG. 1, in accordance with one embodiment of the present invention. As shown in FIG. 2, the wafer carrier 101 and wafer 104 held thereon are positioned in a substantially horizontal orientation, such that a top surface of the wafer 104 when held within the wafer carrier 101 is substantially level. An exterior shape of each of the drive handles 105A/105B is configured to substantially match a shape of the exterior drive surface of the drive rail 109, such that each of the drive handles 105A/105B is configured to interface with the drive surface of the drive rail 109. In one embodiment, the drive surface of the drive rail 109 and the drive handles 105A/105B are configured such that when interfaced together the drive handles 105A/105B will be moveable along the length of the drive rail 109, with minimal allowance for vertical movement of the drive handles 105A/105B relative to the drive rail 109.

Also, an exterior shape of each of the guide supports 107A107B is configured to substantially match a shape of the guide track of the guide rail 111, such that each of the guide supports 107A/107B is configured to interface with the guide track of the guide rail 111. In one embodiment, the guide track of the guide rail 111 and the guide supports 107A/107B are configured such that when interfaced together the guide supports 107A/107B will be moveable along the length of the guide rail 111, with minimal allowance for vertical movement of the guide supports 107A/107B relative to the guide rail 111.

Figure 3:
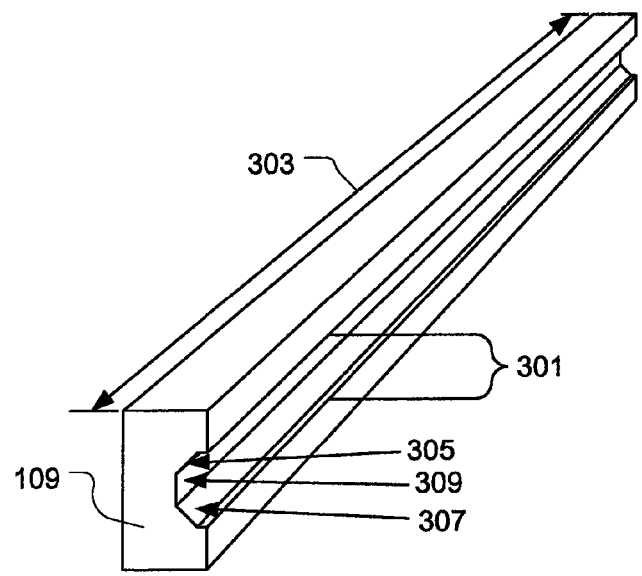
FIG. 3 is an illustration showing an isometric view of the drive rail, in accordance with one embodiment of the present invention.

FIG. 3 is an illustration showing an isometric view of the drive rail 109, in accordance with one embodiment of the present invention. As previously mentioned, the drive rail 109 includes an exterior drive surface 301 that extends along a length 303 of the drive rail 109. The exterior drive surface 301 includes an upper beveled portion 305 and a lower beveled portion 307, separated by a substantially vertical portion 309.

Figure 4A:
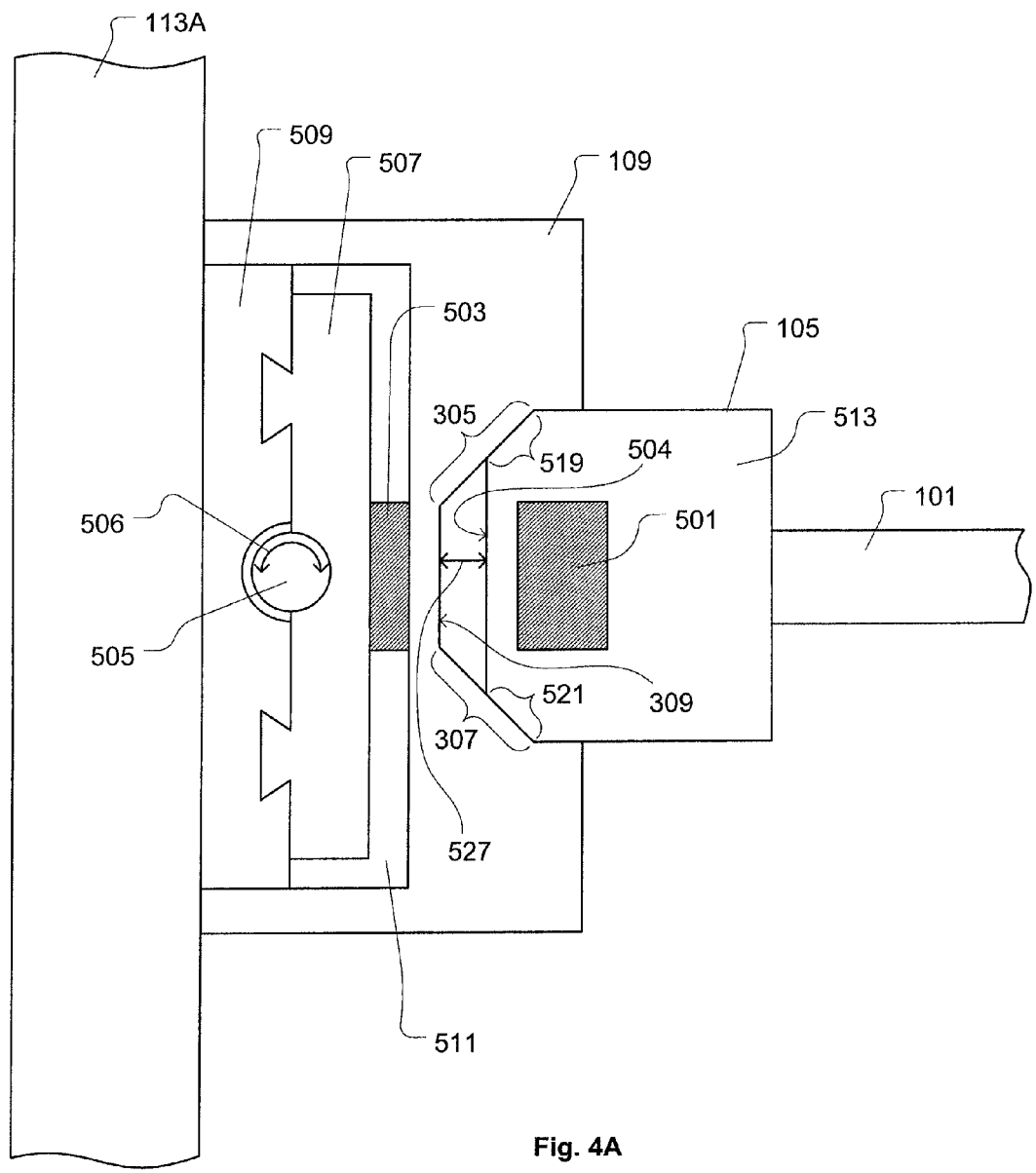
FIG. 4A is an illustration showing a vertical cross-section view of the drive handle interfaced with the drive rail, in accordance with one embodiment of the present invention.

FIG. 4A is an illustration showing a vertical cross-section view of the drive handle 105 interfaced with the drive rail 109, in accordance with one embodiment of the present invention. The drive rail 109 includes an interior cavity 511 and an exterior drive surface. It should be appreciated that the interior cavity 511 of the drive rail 109 is sealed to prevent intrusion of wafer processing solution and to prevent escape of particulates. As previously mentioned, the exterior drive surface of the drive rail 109 is defined by the upper beveled portion 305, the lower beveled portion 307, and the substantially vertical portion 309. A drive magnet 503 is disposed within the interior cavity 511 adjacent to a surface of the interior cavity 511 immediately opposite the substantially vertical portion 309 of the exterior drive surface.

The drive magnet 503 is affixed to a collar 507. The collar 507 is defined to engage a collar track 509 within the interior cavity 511, such that the collar 507 is capable of moving freely along the collar track 509. The collar 507 also includes a threaded surface defined to engage with threads of a screw 505 disposed within the interior cavity 511 between the collar 507 and the collar track 509. Both the collar track 509 and the screw 505 are oriented within the interior cavity 511 to extend along the length 303 of the drive rail 109. Therefore, rotation of the screw 505, as indicated by arrow 506, causes the collar 507 to be moved along the length of the drive rail 109, thereby causing the drive magnet 503 to be moved along the length of the drive rail 109. Thus, controlled rotation of the screw 505 provides for controlled movement of the drive magnet 503 along the drive rail 109. It should be appreciated that as the drive magnet 503 is moved along the length 303 of the drive rail 109 through rotation of the screw 505, the drive magnet 503 remains immediately opposite the substantially vertical portion 309 of the exterior drive surface.

In one embodiment, a motor is mechanically coupled to the screw 505 to provided for controlled rotation of the screw 505. Also, in one embodiment a computer system is defined to control the motor. The computer system can be defined to enable operation of a graphical user interface (GUI) thereon. The GUI is defined to provide for manual specification of a velocity profile to be applied by the motor through the screw 505 to the collar 507, and thereby to the drive magnet 503. The velocity profile specifies a velocity of the drive magnet 503 at each location along the length 303 of the drive rail 109. The velocity profile can be defined such that velocity of the drive magnet 503 at any given location can be within a range extending from zero up to about 500 millimeters per second.

It should be understood that the collar 507, the collar track 509, and the screw 505 mechanically coupled to be driven by the motor, represent one embodiment of a drive mechanism disposed within the interior cavity 511 of the drive rail 109 to provide controlled movement of the drive magnet 503. However, it should be appreciated that the wafer drive apparatus is not limited to use of the above-described drive mechanism. In other embodiments, different types of drive mechanisms can be disposed within the interior cavity 511 of the drive rail 109 to provide controlled movement of the drive magnet 503 along the length 303 of the drive rail 109. For example, in one embodiment, a belt-drive may be utilized to move the drive magnet 503 along the length 303 of the drive rail 109.

With reference back to FIG. 4A, the drive handle 105 is defined by a handle magnet 501 disposed within an encapsulating housing 513. The handle magnet 501 is defined to magnetically couple with the drive magnet 503 through the encapsulating housing 513 and the exterior drive surface of the drive rail 109. The magnetic coupling of the handle magnet 501 to the drive magnet 503 is sufficiently strong to cause the drive handle 105 to be moved along the drive surface of the drive rail 109 as the drive magnet 503 is moved within the interior cavity 511 along the length 303 of the drive rail 109. In this manner, movement of the drive handle 105 along the drive surface of the drive rail 109 causes a corresponding movement of the wafer carrier 101, which is affixed to the drive handle 105, along the length 303 of the drive rail 109.

The encapsulating housing 513 is configured to fully encase the handle magnet 501 so as to prevent exposure of the handle magnet 501 to wafer processing solution. The encapsulating housing 513 is affixed to an edge of the wafer carrier 101, such that movement of the encapsulating housing 513 causes a corresponding movement of the wafer carrier 101. The encapsulating housing 513 includes an exterior track surface defined to interface with the drive surface of the drive rail 109. The exterior track surface of the encapsulating housing 513 includes an upper beveled portion 519, a lower beveled portion 521, and a substantially vertical portion 504 extending between the upper beveled portion 519 and the lower beveled portion 521.

The upper beveled portion 519 of the track surface is defined to substantially match the upper beveled portion 305 of the drive surface. Similarly, the lower beveled portion 521 of the track surface is defined to substantially match the lower beveled portion 307 of the drive surface. Therefore, when the upper and lower beveled portions 519/521 of the drive handle are contacted with the upper and lower beveled portions 305/307 of the drive rail 109, vertical movement capability of the drive handle 105 relative to the drive rail 109 will be minimal. Consequently, as the drive handle 105 is moved down the drive rail 109, while in contact with the drive rail 109, vertical movement of the drive handle 105 relative to the drive rail 109 will be minimized.

The exterior track surface of the encapsulating housing 513 is defined such that when its upper and lower beveled portions 519/521 are in contact with the drive surface upper and lower beveled portions 305/307, the substantially vertical portion 504 of the track surface is separated from the substantially vertical portion 309 of the drive surface. It should be appreciated that separation of the substantially vertical portion of the track surface 504 from the substantially vertical portion 309 of the drive surface provides for reduced friction between the drive handle 105 and the drive rail 109, as the drive handle 105 is moved along the drive rail 109.

In one embodiment, the upper and lower beveled portions 519/521 of the drive handle 105 are configured at 45 degrees relative to the substantially vertical portion 504 of the drive handle 105. Also, in this embodiment, the upper and lower beveled portions 305/307 of the drive rail 109 are configured at 45 degrees relative to the substantially vertical portion 309 of the drive rail 109. It should be understood, however, that in other embodiments the angle of bevel used for the drive surface of the drive rail 109 and the track surface of the drive handle 105 can be configured at essentially any angle up to 90 degrees, so long as the upper and lower bevels are symmetrical.

Figure 4B:
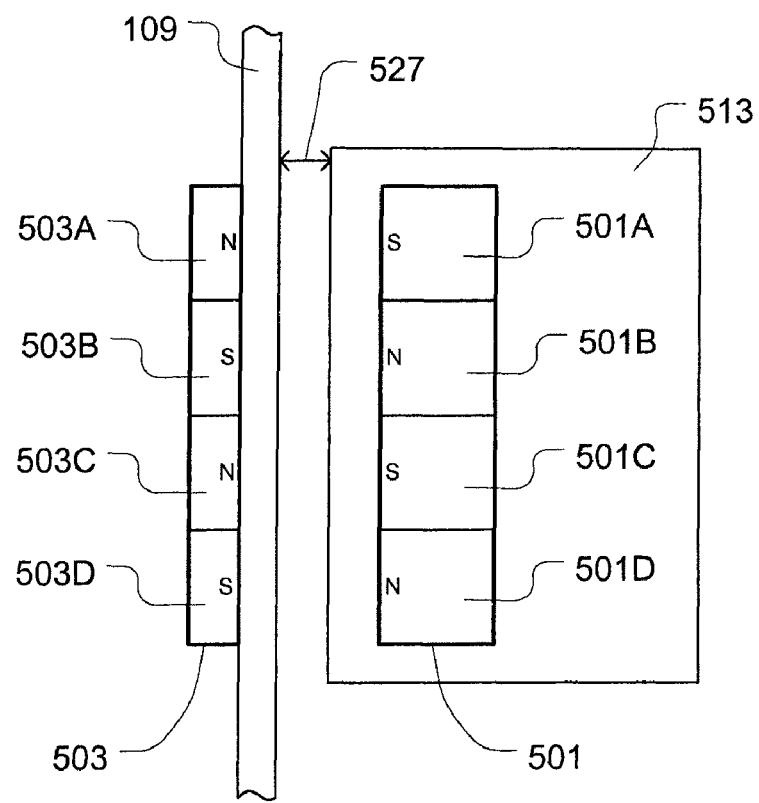
FIG. 4B is an illustration showing a horizontal cross-section view of the drive magnet magnetically coupled to the handle magnet, in accordance with one embodiment of the present invention.

FIG. 4B is an illustration showing a horizontal cross-section view of the drive magnet 503 magnetically coupled to the handle magnet 501, in accordance with one embodiment of the present invention. In this embodiment, the drive magnet 503 is defined by a number of magnets 503A-503D positioned side-by-side with alternating polarities. Also, in this embodiment, the handle magnet 501 is defined by a number of magnets 501A-501D positioned side-by-side with alternating polarities. The sequence of polarities in the magnets 501A-501D is opposite from the sequence of polarities in the magnets 503A-503D, such that each of magnets 501A-501D will simultaneously couple with a respective one of magnets 503A-503D. Although the above-described embodiment shows four magnets used to define each of the drive magnet 503 and the handle magnet 501, it should be understood that in other embodiments each of the drive magnet 503 and the handle magnet 501 can be formed from essentially any number of magnets.

The drive magnet 503 and the handle magnet 501 are capable of magnetically coupling to each other through the exterior drive surface of the drive rail 109, across a horizontal space 527 separating the vertical portions 504/309 of the drive handle 105 and the drive rail 109, and through the encapsulating housing 513 of the drive handle 105. In one embodiment, each of the drive magnet 503 and the handle magnet 501 is formed of NdFeB, and provides a magnetic coupling strength therebetween within a range extending from about 5 force-pounds to about 20 force-pounds. In one particular embodiment, each of the drive magnet 503 and the handle magnet 501 is formed of NdFeB and provides a magnetic coupling strength therebetween of about 12.8 force-pounds. It should be understood, however, that in other embodiments different types of magnets may be used for the drive magnet 503 and handle magnet 501, so long as the magnetic coupling strength is sufficient to enable movement of the drive handle 105, with wafer carrier 101 affixed thereto, along the drive rail 109.

In one embodiment, the drive rail 109 is formed of polyethylene terephthalate (PET) and the encapsulating housing 513 is formed of ultra high molecular weight polyethylene (UHMWP). Both the PET and the UHMWP are transparent to the magnetic field between the drive magnet 503 and the handle magnet 501. It should be appreciated that in other embodiments, other materials can be used for the drive rail 109 and the encapsulating housing 513, so long as the other materials are chemically compatible with the wafer processing solution to which they will be exposed, are sufficiently transparent to the magnetic field between the drive magnet 503 and handle magnet 501, and have a sufficiently low coefficient of friction such that the magnetic coupling between the drive magnet 503 and the handle magnet 501 is sufficient to enable movement of the drive handle 105 along the drive rail 109.

Also, in one embodiment, the guide rail 111 is formed of PET and the guide support 107 is formed of UHMWP. It should be appreciated that in other embodiments, other materials can be used for the guide rail 111 and the guide support 107, so long as the other materials are chemically compatible with the wafer processing solution to which they will be exposed, and have a sufficiently low coefficient of friction to enable movement of the guide support 107 along the guide rail 111.

Figure 5A:
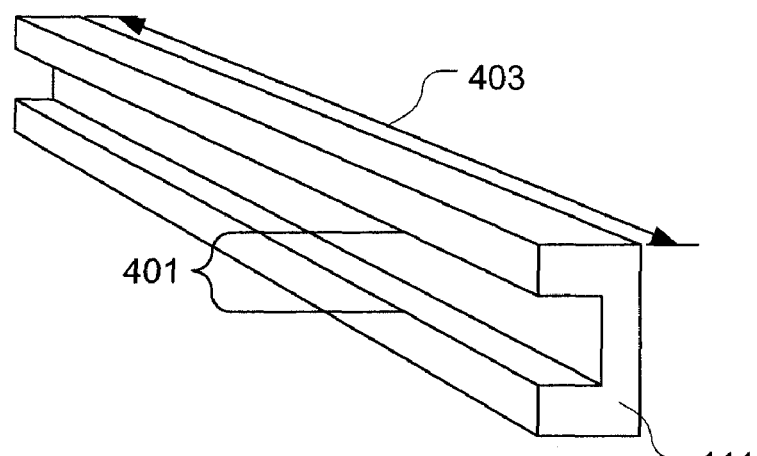
FIG. 5A is an illustration showing an isometric view of the guide rail, in accordance with one embodiment of the present invention.
Figure 5B:
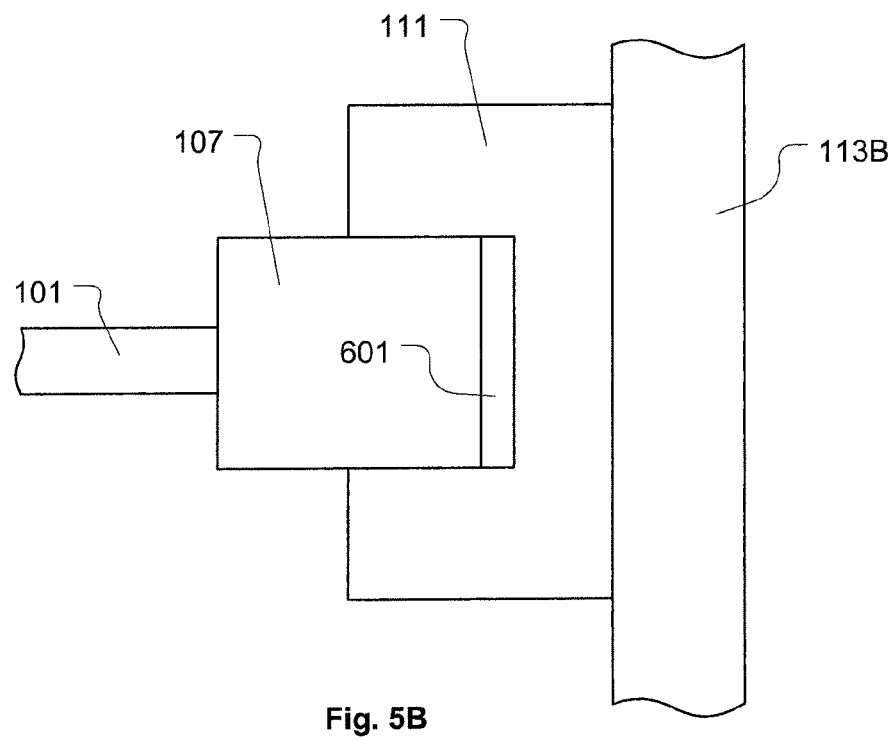
FIG. 5B is an illustration showing a vertical cross-section view of the guide support interfaced with the guide rail, in accordance with one embodiment of the present invention.

FIG. 5A is an illustration showing an isometric view of the guide rail 111, in accordance with one embodiment of the present invention. The guide rail 111 is defined to include a guide track 401 defined along a length 403 of the guide rail 111. The guide track 401 is defined to receive the guide supports 107A/107B. FIG. 5B is an illustration showing a vertical cross-section view of the guide support 107 interfaced with the guide rail 111, in accordance with one embodiment of the present invention. In this embodiment, each of the guide support 107 and guide track 401 have a rectangular-shaped vertical cross-section. The guide track 401 is sized such that when the guide support 107 is inserted into the guide track 401, the guide support 107 is freely movable along the length 403 of the guide rail 111 with minimal vertical movement of the guide support 107 relative to the guide rail 111. Also, in this embodiment, the guide track 401 is sized such that a gap 601 exists between an outer edge of the guide support 107 and the guide rail 111.

Figure 6:
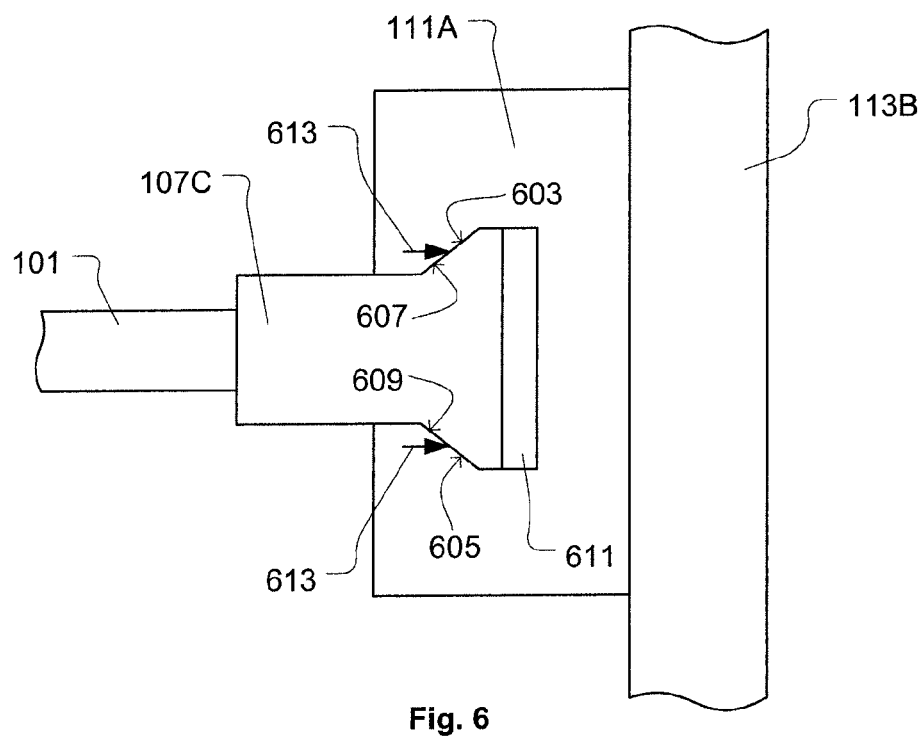
FIG. 6 is an illustration showing a vertical cross-section view of a tensioning guide support interfaced with a tensioning guide rail, in accordance with one embodiment of the present invention.

FIG. 6 is an illustration showing a vertical cross-section view of a tensioning guide support 107C interfaced with a tensioning guide rail 111A, in accordance with one embodiment of the present invention. The tensioning guide rail 111A is the same as the guide rail 111 previously discussed, with the exception of the guide track vertical cross-section shape. The tensioning guide rail 111A includes a guide track 611 defined to have an upper beveled surface 603 and a lower beveled surface 605. A tensioning guide support 107C is affixed to the guide edge of the wafer carrier 101. The tensioning guide support 107C includes an upper beveled surface 607 and lower beveled surface 609, such that when the tensioning guide support 107C is inserted into the guide track 611, the upper beveled surfaces 607 and 603 interface with each other, and the lower beveled surfaces 609 and 605 interface with each other. In this manner, the guide track 611 is configured to provide a resistive force 613 to the tensioning guide support 107C in a direction extending away from the drive rail 109, such that the resistive force 613 and the magnetic coupling between the drive magnet 503 and the handle magnet 501 apply tension to the wafer carrier 101 in a direction extending between the drive rail 109 and the tensioning guide rail 111A.

Figure 7A:
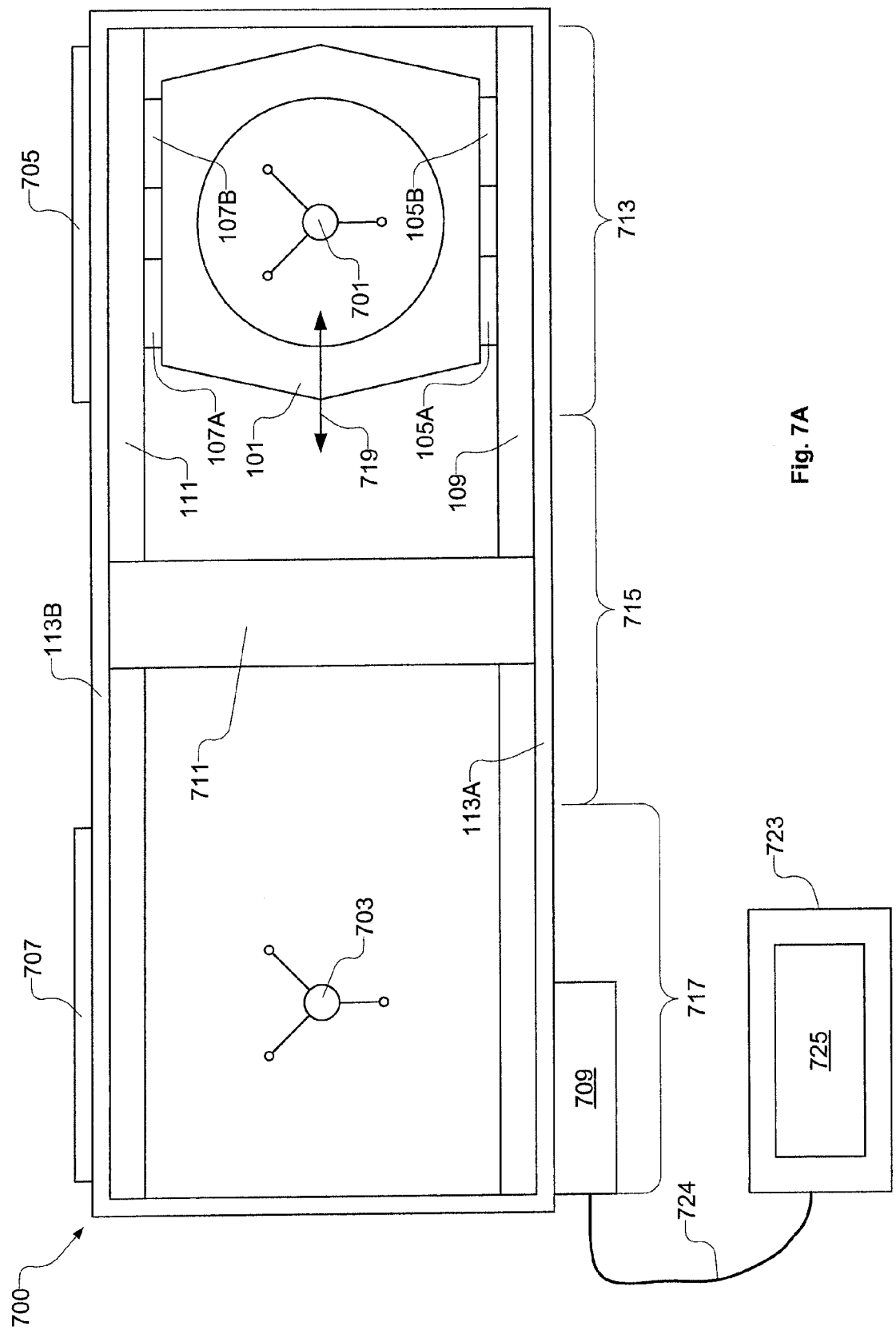
FIG. 7A is an illustration showing a wafer wet processing chamber that incorporates a system for linear translation of a wafer based on the wafer drive apparatus described herein, in accordance with one embodiment of the present invention.

FIG. 7A is an illustration showing a wafer wet processing chamber 700 that incorporates a system for linear translation of a wafer based on the wafer drive apparatus described herein, in accordance with one embodiment of the present invention. The chamber is defined by exterior walls that include the substantially parallel side walls 113A and 113B. The drive rail 109 is attached to the side wall 113A in a substantially level orientation. The guide rail 111 is attached to the side wall 113B in a substantially level orientation. The wafer carrier 101 is disposed in a substantially level orientation so as to extend between the drive rail 109 and the guide rail 111. The pair of drive handles 105A/105B are affixed to the drive side of the wafer carrier 101, and are positioned to contact the exterior drive surface of the drive rail 109. The pair of guide supports 107A/107B are affixed to the guide side of the wafer carrier 101, and are positioned to interface with the guide track of the guide rail 111. The handle magnets 501 within the drive handles 105A/105B are magnetically coupled to respective drive magnets 503 within the interior cavity 511 of the drive rail 109. Therefore, linear movement of the drive magnets 503 within the drive rail 109 will cause a corresponding linear movement of the wafer carrier 101 along the drive rail 109, as indicated by arrow 719.

A motor 709 is mechanically coupled to a drive mechanism within the interior cavity 511 of the drive rail 109 to provide for controlled movement of the drive magnets 503 along the length of the drive rail 109. The motor 709 is connected to a computer system 723 by way of a control link 724. The computer system 723 is defined to control the motor 709. In one embodiment, the computer system 723 operates a GUI 725 defined to provide for manual specification of the velocity profile to be applied by the motor 709 to the drive magnets 503. As previously mentioned, the velocity profile specifies a velocity of the drive magnets 503 at each location along the length of the drive rail 109.

The chamber 700 includes an input module 713, a processing module 715, and an output module 717. The drive rail 109 and the guide rail 111 extend continuously through each of the input module 713, the processing module 715, and the output module 717. Therefore, the wafer carrier 101 can be moved linearly along the drive rail 109 and guide rail 111 through each of the input module 713, the processing module 715, and the output module 717. The input module 713 includes a door assembly 705 through which a wafer can be inserted into the chamber 700 by a wafer handling device. The input module also includes a wafer lifter 701 defined to move vertically through the open region 103 of the wafer carrier 101, when the wafer carrier 101 is centered thereover in the input module 713. The wafer lifter 701 can be raised to receive a wafer when inserted into the chamber 700 through the door assembly 705. The wafer lifter 701 can then be lowered to place the wafer on the wafer carrier 101 and clear the travel path of the wafer carrier 101.

Figure 7B:
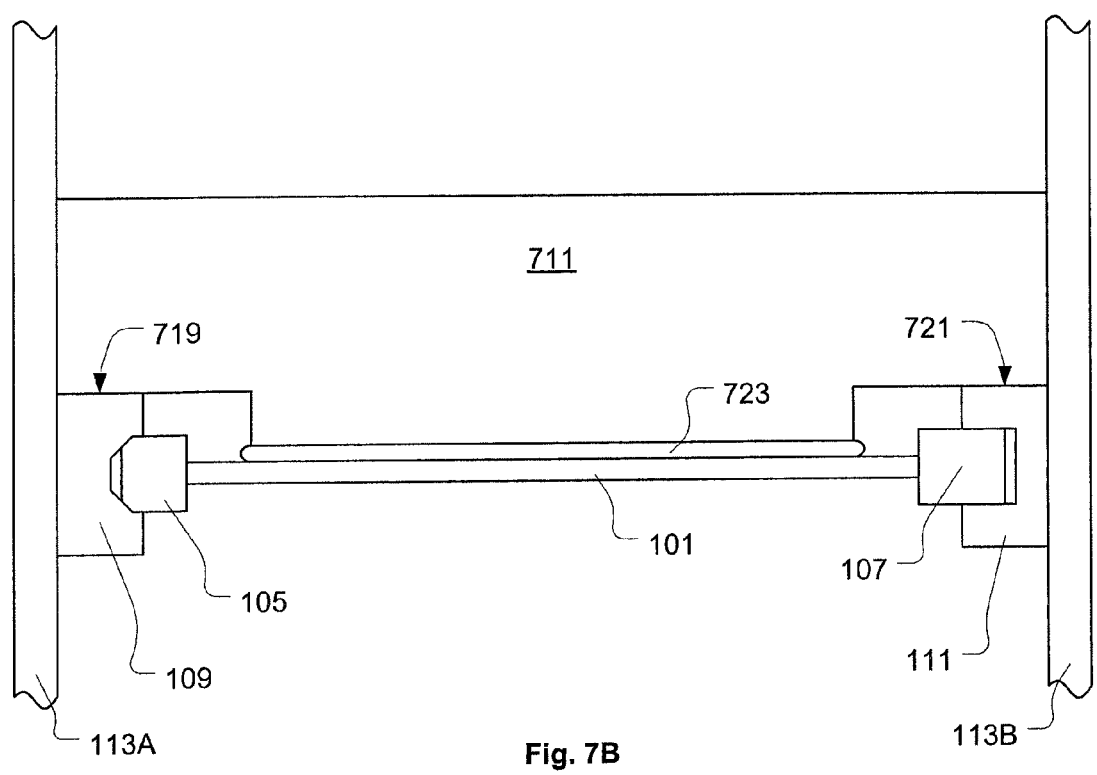
FIG. 7B is an illustration showing a vertical cross-section view of the chamber with the wafer carrier located beneath the processing head, in accordance with one embodiment of the present invention.

The processing module 715 includes a processing head 711 disposed to interface with a wafer to be carried by the wafer carrier 101. FIG. 7B is an illustration showing a vertical cross-section view of the chamber 700 with the wafer carrier 101 located beneath the processing head 711, in accordance with one embodiment of the present invention. The processing head 711 is mounted to both the drive rail 109 and the guide rail 111, as shown at locations 719 and 721, respectively, such that a vertical position of the processing head 711 is indexed to both a vertical position of the drive rail 109 and a vertical position of the guide rail 111. The processing head 711 is defined to expose the wafer present on the wafer carrier 101 to a processing solution. In some embodiments, the processing head 711 is defined to dispense a meniscus 723 of processing solution onto the wafer surface as the wafer traverses beneath the processing head 711. The processing solution is formulated to react with the wafer surface to achieve a particular wafer processing result. In one embodiment, the processing head 711 is equipped to perform multiple wafer processing operations as the wafer is moved under the processing head 711 by the wafer carrier 101. For example, in one embodiment, the processing head 711 can be equipped to process the wafer surface, rinse the wafer surface, and dry the wafer surface, as the wafer traverses thereunder. Also, in another embodiment, multiple processing heads 711 can be mounted to the drive rail 109 and guide rail 111, such that the wafer carrier 101 moves the wafer under each of the multiple processing heads 711.

It should be appreciated that the wafer carrier drive apparatus described herein can be utilized with essentially any type of processing head 711. A key feature, however, is that the processing head 711 is indexed to the vertical positions of the drive rail 109 and guide rail 111. In this manner, control of the vertical separation distance between the processing head 711 and the wafer, as the wafer carrier 101 moves beneath the processing head 711, is achieved by indexing the vertical position of the processing head 711 to each of the drive rail 109 and guide rail 111.

Once the wafer carrier 101 moves through the processing module 715, the wafer carrier 101 arrives at the output module 717. The output module 717 includes a wafer lifter 703 defined to move vertically through the open region 103 of the wafer carrier 101, when the wafer carrier 101 is centered thereover in the output module 717. The wafer lifter 703 can be raised to lift the wafer from the wafer carrier 101 to a position for retrieval from the chamber 700. The output module 717 also includes a door assembly 707 through which a wafer can be retrieved from the chamber 700 by a wafer handling device. Once the wafer is retrieved off of the wafer lifter 703, the wafer lifter 703 can be lowered to clear the travel path of the wafer carrier 101. Then, the wafer carrier 101 is moved back to the input module 713 to retrieve the next wafer for processing.

It should be appreciated that the wafer carrier drive apparatus as described herein does not have any metal components exposed to the chamber processing environment. Also, the materials used to form the drive rail 109, drive handles 105A/105B, guide rail 111, and guide supports 107A/107B are selected to be compatible with the wafer processing solution chemistry. Therefore, the wafer carrier drive apparatus is defined to avoid adverse interaction with the wafer processing solution chemistry. Additionally, it should be appreciated that the wafer carrier drive apparatus component materials are selected to allow their frictional interface with each other while minimizing corresponding particulate generation. Also, it should be appreciated that because the mechanical components of the drive mechanism are enclosed within the sealed interior cavity 511 of the drive rail 109, any particulate generation from the drive mechanism is prevented from reaching the wafer processing environment.

Figure 8:
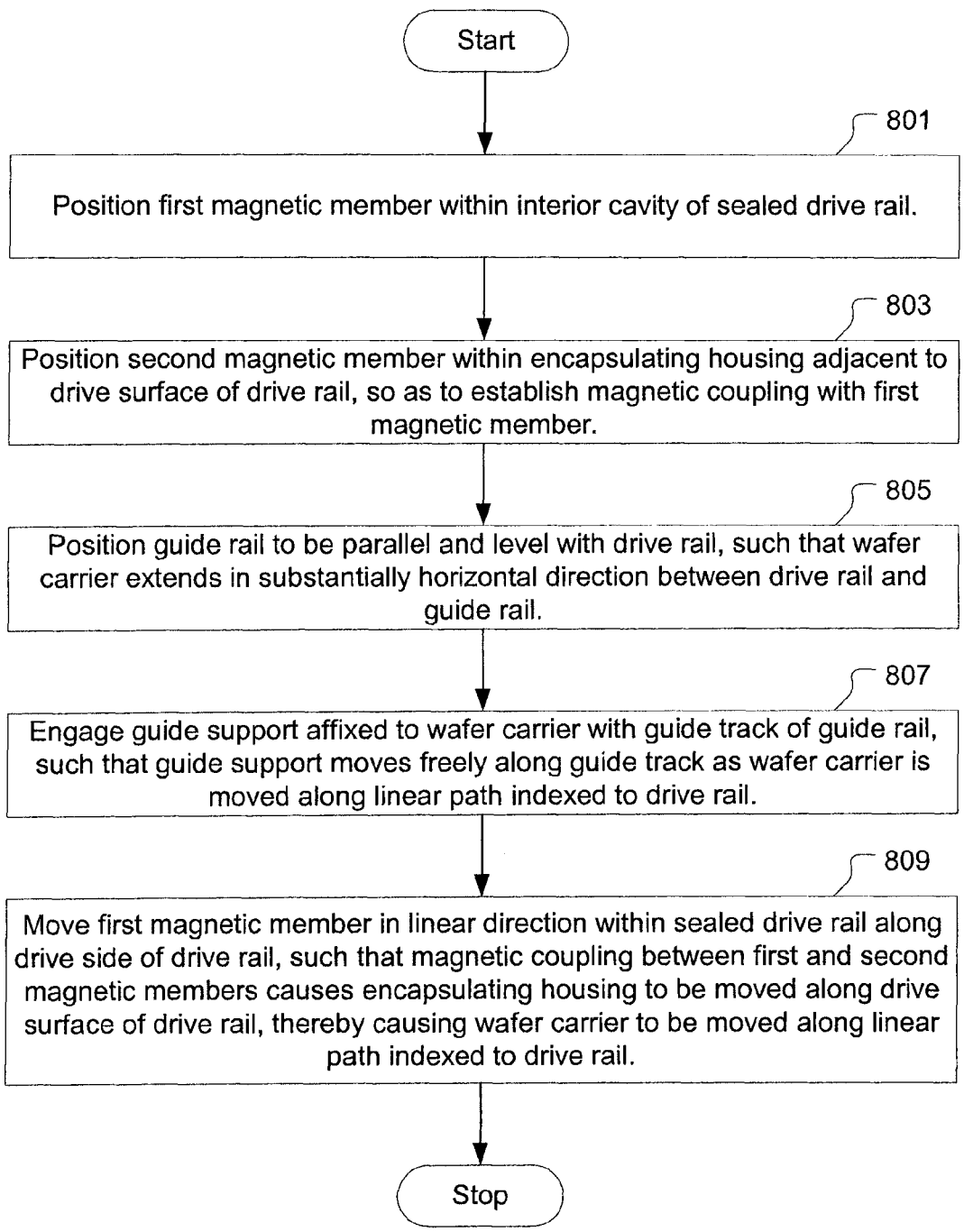
FIG. 8 is an illustration showing a flowchart of a method for driving a semiconductor wafer carrier, in accordance with one embodiment of the present invention.

FIG. 8 is an illustration showing a flowchart of a method for driving a semiconductor wafer carrier, in accordance with one embodiment of the present invention. The method includes an operation 801 for positioning a first magnetic member within an interior cavity of a sealed drive rail. An example of the first magnetic member is the above-described drive magnet 503. Also, an example of the drive rail is the above-described drive rail 109. The first magnetic member is positioned proximate to a drive side of the drive rail, wherein an exterior of the drive side forms a drive surface.

The method also includes an operation 803 for positioning a second magnetic member within an encapsulating housing adjacent to the drive surface of the drive rail. An example of the second magnetic member is the above-described handle magnet 501 within the encapsulating housing 513. The encapsulating housing is affixed to a wafer carrier. For example, as described above, the encapsulating housing 513 is affixed to the wafer carrier 101. The second magnetic member is positioned adjacent to the drive surface so as to establish a magnetic coupling with the first magnetic member. The encapsulating housing is defined to interface with the drive surface such that vertical movement of the encapsulating housing is minimized when the encapsulating housing is moved along the drive surface.

The method also includes an operation 805 for positioning a guide rail to be parallel and level with the drive rail, such that the wafer carrier extends in a substantially horizontal direction between the drive rail and the guide rail. An example of the guide rail is the above-described guide rail 111. The guide rail is defined to include a guide track. In an operation 807, a guide support affixed to the wafer carrier is engaged with the guide track of the guide rail, such that the guide support moves freely along the guide track as the wafer carrier is moved along the linear path indexed to the drive rail. The guide support is defined to interface with the guide track so as to minimize vertical movement of the guide support relative to the guide rail. Examples of the guide support can include the above-described guide supports 107A/107B or tensioning guide support 107C. With the tensioning guide support 107C, a resistance between the guide support and the guide rail combine with the magnetic coupling between the first and second magnetic members to apply tension to the wafer carrier in a direction extending between the drive rail and the guide rail.

The method continues with an operation 809 for moving the first magnetic member in a linear direction within the sealed drive rail along the drive side of the drive rail, such that the magnetic coupling between the first and second magnetic members causes the encapsulating housing to be moved along the drive surface of the drive rail, thereby causing the wafer carrier to be moved along a linear path indexed to the drive rail. In one embodiment, the first magnetic member is moved in the linear direction along the drive rail in an automated manner in accordance with a prescribed velocity profile. The prescribed velocity profile specifies a velocity of the first magnetic member at each location along a length of the drive rail.

In one embodiment, a processing head is mounted to both the drive rail and the guide rail, such that the processing head extends between the drive rail and the guide rail. Therefore, the processing head is mounted such that a vertical position of the processing head is indexed to a vertical position of the drive rail and a vertical position of the guide rail. In this embodiment, movement of the wafer carrier along the linear path indexed to the drive rail causes a wafer, when present in the wafer carrier, to be exposed to a meniscus of processing solution to be delivered from the processing head, such as described above with regard to FIGS. 7A-7B.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated. Further, the manipulations performed are often referred to in terms such as producing, identifying, determining, or comparing. Any of the operations described herein may be directed, controlled, or performed by a computer system. The computer system can be specially constructed for the required purpose, or the computer system can be a general-purpose computer selectively activated or configured by a computer program stored in the computer.

A computer program can be defined to control and monitor the wafer carrier drive apparatus. Such a computer program can be defined to provide a GUI for enabling a user to control the wafer carrier drive apparatus and monitor a state of the wafer carrier position and velocity. Such a computer program can be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A system for linear translation of a semiconductor wafer, comprising:
    a drive rail having an interior cavity and an exterior drive surface, wherein the interior cavity is sealed, and wherein the exterior drive surface extends along a length of the drive rail and includes an upper beveled portion and a lower beveled portion;
    a first magnetic member disposed within the interior cavity and adjacent to a surface of the interior cavity immediately opposite the exterior drive surface, the first magnetic member configured to be moved in a controlled manner within the interior cavity along the length of the drive rail;
    a wafer carrier configured to hold a semiconductor wafer in a substantially horizontal orientation;
    a second magnetic member disposed within an encapsulating housing, wherein the encapsulating housing is affixed to the wafer carrier, the encapsulating housing having an exterior track surface including an upper beveled portion and a lower beveled portion,
    wherein the first and second magnetic members are configured to be magnetically coupled to each other through the encapsulating housing and the exterior drive surface when the upper and lower beveled portions of the exterior track surface of the encapsulating housing are respectively disposed adjacent to the upper and lower beveled portions of the exterior drive surface of the drive rail, such that movement of the first magnetic member causes a corresponding movement of the encapsulating housing and wafer carrier affixed thereto;
    a guide rail disposed to be substantially parallel and level with the drive rail such that the wafer carrier extends in a substantially horizontal direction from the drive rail to the guide rail, and wherein the guide rail includes a guide track defined along a length of the guide rail; and
    a guide support affixed to the wafer carrier so as to engage the guide rail when the encapsulating housing is contact with the exterior drive surface of the drive rail, wherein the guide support is configured to be freely movable along the length of the guide rail with restricted vertical movement of the guide support relative to the guide rail.

2. A system for linear translation of a semiconductor wafer as recited in claim 1, further comprising:
    a drive mechanism disposed within the interior cavity of the drive rail to provide controlled movement of the first magnetic member.

3. A system for linear translation of a semiconductor wafer as recited in claim 2, wherein the drive mechanism is defined as a screw mechanically coupled to be driven by a motor, and wherein threads of the screw are defined to engage threads of a collar to which the first magnetic member is affixed, such that rotation of the screw causes the collar to be moved within the interior cavity along the length of the drive rail.

4. A system for linear translation of a semiconductor wafer as recited in claim 3, further comprising:
    a computer system defined to control the motor; and
    a graphical user interface (GUI) defined to operate on the computer system, the GUI defined to provide for manual specification of a velocity profile to be applied by the motor through the screw and collar to the first magnetic member, wherein the velocity profile specifies a velocity of the first magnetic member at each location along the length of the drive rail.

5. A system for linear translation of a semiconductor wafer as recited in claim 1, wherein the guide rail has a length substantially equal to the length of the drive rail.

6. A system for linear translation of a semiconductor wafer as recited in claim 5, wherein both the drive rail and the guide rail are configured to provide mounting surfaces for a wafer processing head, such that a vertical position of the drive rail and a vertical position of the guide rail control a vertical position of the wafer processing head when the wafer processing head is disposed to contact both the drive rail and guide rail mounting surfaces.

7. A system for linear translation of a semiconductor wafer as recited in claim 6, wherein the system is disposed within a wafer wet processing chamber such that the drive rail and guide rail are disposed to provide linear translation of the wafer carrier from an input module, through a processing module, to an output module, wherein linear translation of the wafer carrier through the processing module provides for exposure of a wafer when held on the wafer carrier to a meniscus of processing solution to be delivered from the wafer processing head.

8. A method for driving a semiconductor wafer carrier, comprising:
    positioning a first magnetic member within an interior cavity of a sealed drive rail such that the first magnetic member is positioned proximate to a drive side of the drive rail, wherein an exterior of the drive side forms a drive surface including an upper beveled portion and a lower beveled portion;
    positioning a second magnetic member within an encapsulating housing having an exterior track surface including an upper beveled portion and lower beveled portion, such that the upper and lower beveled portions of the exterior track surface are respectively positioned adjacent to the upper and lower beveled portions of the drive surface of the drive rail, wherein the encapsulating housing is affixed to a wafer carrier, and whereby the second magnetic member establishes a magnetic coupling with the first magnetic member;
    moving the first magnetic member in a linear direction within the sealed drive rail along the drive side such that the magnetic coupling between the first and second magnetic members causes the encapsulating housing to be moved along the drive surface of the drive rail, thereby causing the wafer carrier to be moved along a linear path indexed to the drive rail;
    positioning a guide rail to be parallel and level with the drive rail such that the wafer carrier extends in a substantially horizontal direction between the drive rail and the guide rail, wherein the guide rail includes a guide track; and
    engaging a guide support affixed to the wafer carrier with the guide track such that the guide support moves freely along the guide track as the wafer carrier is moved along the linear path indexed to the drive rail, and such that vertical movement of the guide support relative to the guide rail is restricted.

9. A method for driving a semiconductor wafer carrier as recited in claim 8, wherein the encapsulating housing is defined to interface with the drive surface such that vertical movement of the encapsulating housing is minimized when the encapsulating housing is moved along the drive surface.

10. A method for driving a semiconductor wafer carrier as recited in claim 8, wherein the first magnetic member is moved in the linear direction in an automated manner in accordance with a prescribed velocity profile, wherein the prescribed velocity profile specifies a velocity of the first magnetic member at each location along a length of the drive rail.

11. A method for driving a semiconductor wafer carrier as recited in claim 8, wherein a resistance between the guide support and the guide rail combine with the magnetic coupling between the first and second magnetic members to apply tension to the wafer carrier in a direction extending between the drive rail and the guide rail.

12. A method for driving a semiconductor wafer carrier as recited in claim 8, further comprising:

moving the wafer carrier along the linear path indexed to the drive rail such that the wafer carrier moves below a processing head that has a vertical position indexed to both the drive rail and guide rail.

* * * * *